United States Patent
Bernardus Peters et al.

(10) Patent No.: US 6,428,731 B1
(45) Date of Patent: Aug. 6, 2002

(54) MOULD PART, MOULD AND METHOD FOR ENCAPSULATING ELECTRONIC COMPONENTS MOUNTED ON A CARRIER

(75) Inventors: Hendrikus Johannes Bernardus Peters, Didam; Marcel Gerardus Antonius Tomassen, Zevenaar, both of (NL)

(73) Assignee: Fico, B.V. (NL)

(*) Notice: Subject to any disclaimer, the term of this patent is extended or adjusted under 35 U.S.C. 154(b) by 0 days.

(21) Appl. No.: 09/623,443

(22) PCT Filed: Mar. 4, 1999

(86) PCT No.: PCT/NL99/00118
§ 371 (c)(1),
(2), (4) Date: Nov. 9, 2000

(87) PCT Pub. No.: WO99/45586
PCT Pub. Date: Sep. 10, 1999

(30) Foreign Application Priority Data

Mar. 5, 1998 (NL) .............................................. 1008488

(51) Int. Cl.⁷ .......................... B29C 45/14; B29C 45/02; B29C 70/70
(52) U.S. Cl. ............................. 264/272.13; 264/272.14; 264/272.15; 264/272.17; 425/116; 425/123; 425/544; 425/572
(58) Field of Search ....................... 264/272.11, 272.14, 264/272.17, 272.15, 272.13; 29/825, 827, 832; 425/116, 121, 123, 129.1, 544, 572, 120

(56) References Cited

U.S. PATENT DOCUMENTS

| | | | | |
|---|---|---|---|---|
| 4,252,294 A | * | 2/1981 | Uchio | 249/105 |
| 4,513,942 A | * | 4/1985 | Creasman | 249/95 |
| 5,698,242 A | * | 12/1997 | Chen et al. | 425/544 |
| 5,824,252 A | * | 10/1998 | Miyajima | 264/272.17 |
| 5,891,384 A | * | 4/1999 | Miyajima | 264/511 |
| 5,955,021 A | * | 9/1999 | Tiffany, III | 264/272.11 |
| 6,256,873 B1 | * | 7/2001 | Tiffany, III | 29/827 |

FOREIGN PATENT DOCUMENTS

| | | |
|---|---|---|
| GB | 2293130 | 2/1996 |
| JP | 02044739 | 4/1990 |
| JP | 04025035 | 1/1992 |
| JP | 09036151 | 7/1995 |

* cited by examiner

*Primary Examiner*—Angela Ortiz
(74) *Attorney, Agent, or Firm*—Webb Ziesenheim Logsdon Orkin & Hanson, P.C.

(57) ABSTRACT

The invention relates to a mould part of a mould for encapsulating electronic components mounted on a carrier, composing at least one mould cavity provided in said mould part and at least one runner for moulding material connecting to said mould cavity, wherein the gate from said runner to said mould cavity has an oblong shape. The invention also relates to a mould with at least one such mould part. The invention also provides a method for encapsulating electronic components mounted on a carrier, wherein the liquid moulding material is fed into the mould cavity through a wide supply opening. Finally, the invention also provides an encapsulated electronic component mounted on a carrier, which component is manufactured by this method.

10 Claims, 2 Drawing Sheets

MOULD PART, MOULD AND METHOD FOR ENCAPSULATING ELECTRONIC COMPONENTS MOUNTED ON A CARRIER

BACKGROUND OF INVENTION

Field of the Invention

The invention relates to a mould part and mould for encapsulating electronic components mounted on a carrier. The invention also relates to a method for encapsulating electronic components mounted on a carrier Such a mould and method from prior art whereby using for instance epoxy resin a package of moulding material can be applied around an electronic component mounted on a carrier such as a lead frame or BGA. One particular application of this technique is encapsulating semi-conductor products, such as chips.

One of the market trends is the mounting on a carrier of encapsulating packages of an ever-increasing area. These packages can be subdivided by sawing during further processing. The drawback of the current gate to a mould cavity is that the filling of larger-area mould cavities calls for higher encapsulating material flow velocities. This in turn may result in the formation of gas inclusions or stresses in an encapsulating material package after curing.

JP 02 0447439 discloses a method and apparatus for forming a resin-sealed package in a cavity with a widely opened gate over one sidewall of the cavity. This results in a short transfer time of the resin without increasing the charging speed of the resin. Although this technique provides an improvement in the filling speed of a mould cavity it is difficult to produce an equal flow speed of the encapsulating material over the whole length of the gate opening, thus giving problems in an equal filling of the mould cavity.

The present invention has for its object to upgrade both the mould and the method of encapsulating electronic components mounted on a carrier whereby high-speed and well-controlled production of larger-area packages of encapsulating material is possible.

SUMMARY OF THE INVENTION

To this end the invention provides a mould part. The gate of oblong shape from the runner to the mould cavity herein preferably runs parallel to a contact face of the associated mould part for cooperation with a counter mould part. An advantage of an oblong supply opening is that encapsulating material can be fed simultaneously into the mould cavity over the entire supply opening length. At least one runner debouches into a distribution chamber for encapsulating material, which distribution chamber transposes into the mould cavity by means of the gate of oblong shape to evenly distribute the pressure in the distribution chamber, whereby the encapsulating material will then flow uniformly into the mould cavity along the entire length of the gate. On initiation of an encapsulating operation the encapsulating material will first of all fill the distribution chamber before entering the mould cavity. This enables a large mould cavity to be filled equally with encapsulating material in a relatively short period of time without the flow velocities of the encapsulating material having to be high. The present invention thus enables a package of high-grade encapsulating material of a fairly large area to be manufactured on a controlled way in a brief period of time. Another advantage of the mould part according to the invention is its high flexibility in use. If, for example, a plurality of runners for moulding material open onto a specific mould cavity, they should, for homogeneous filling of the mould cavity, debouch into the mould cavity at positions where they are located close to the electronic components to be encapsulated. This means the positions where the runners open onto the mould cavity depend on the locations of the electronic components to be encapsulated. This is why the prior art causes the mould structure to depend on the orientation of the mounting of the components on the carrier. With gating through an oblong connection in accordance with the invention a mould cavity may be wholly filled irrespective of the orientation of the mounting of the electronic components for encapsulating on the carrier. This enables a wide variety of products to be encapsulated using one single mould. It is only the shape of the carrier and the location at which the packages of encapsulating material have to be arranged which are determined by the mould. A mould part and a mould according the invention are therefore flexible in use.

The oblong gate from runner to mould cavity may have different shapes. It may be straight for opening onto a straight mould cavity face, angular for opening onto a mould cavity angle or for instance curved for opening onto a curved mould cavity face. Although mould cavities are generally substantially rectangular, the present invention can be used irrespective of the mould cavity shape. Partly subject to mould cavity dimensions and the encapsulating material to be used, it is for instance possible to choose a gating via one long side of a mould cavity or a mould cavity angle. An alternative is to fit a mould cavity with a plurality of oblong gates.

This encapsulating material distribution chamber is preferably recessed further into said mould part than the gate of oblong shape. A threshold-like elevation is thus positioned between distribution chamber and mould cavity, making that the distribution chamber will be filled before the encapsulation material enters the mould cavity. An additional advantage is that it is possible to manufacture comparatively thin packages of encapsulating material, since the encapsulating material enters the mould cavity as a thin layer.

While the mould cavity is being filled with encapsulating material, the gas present in the mould cavity should be able to escape from the mould cavity. To this end the mould cavity is provided with a gas discharge opening, which is also oblong in shape. A preferred embodiment of the mould cavity is provided with a plurality of gas discharge openings of which the gates run substantially parallel to the gate of oblong shape. The encapsulating material flows through the mould cavity across a wide front and, in order to prevent the formation of gas inclusions, the gas should be able to escape from the mould cavity at various positions. This is found to be a particularly advantageous option when the discharge opening is oblong-shaped and runs substantially parallel to the front of the flowing encapsulating material in the mould cavity.

The invention also provides a mould for encapsulating electronic components mounted on a carrier, which mould comprises at least one mould part as specified above. The above described mould part functions only in co-action with a counter mould part.

The invention also provides a method for encapsulating an electronic component mounted on a carrier. The moulding material is herein preferably fed into the mould cavity as a thin layer with a substantially constant front. The wide front of encapsulating material will be forced over the electronic components to be encapsulated in more or less constant manner, which is why the orientation of the electronic components on the carrier is irrelevant to the choice of a specific mould. The other advantages of this method have already been described with reference to the mould part according the invention.

BRIEF DESCRIPTION OF THE DRAWINGS

The present invention will now be further elucidated with reference to the non-limitative embodiments shown in the following figures. Herein.

DETAILED DESCRIPTION OF THE PREFERRED EMBODIMENTS

Figure 1:
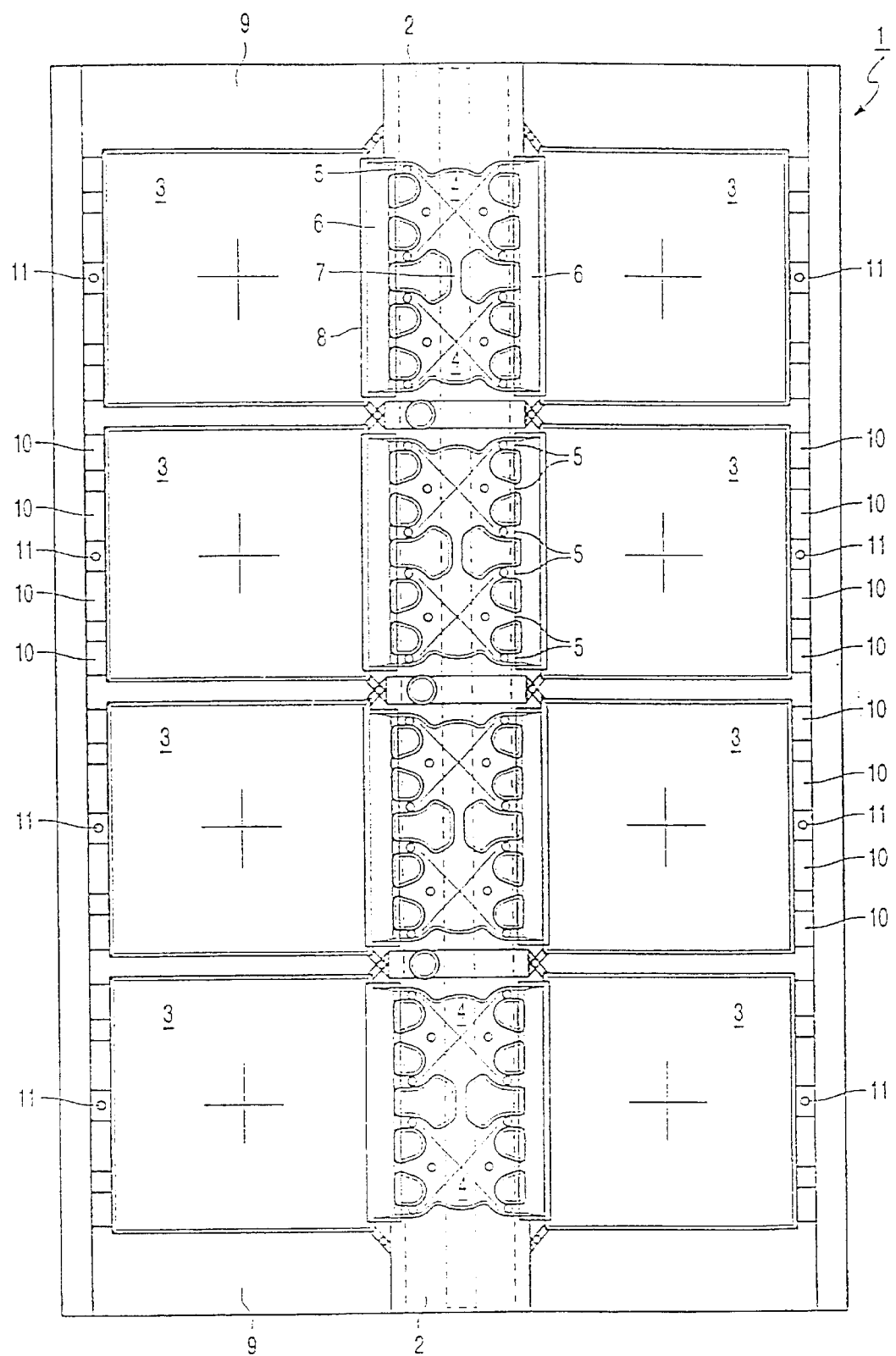
FIG. 1 shows a bottom view of a mould part according to the invention.

FIG. 1 shows a view of an upper mould part 1, in which what is called a "cull strip" 2 is located centrally, on both sides of which are arranged mould cavities 3. Cull strip 2 is provided with recessed collecting chambers 4, into which a plunger, not shown in this figure, forces liquid encapsulating material. The liquid encapsulating material then flows through runners 5 to distribution chambers 6. In mould part 1 shown in this figure sets of two collecting chambers 4 are mutually connected by a coupling channel 7. In addition, each collecting chamber 4 is connected on two opposite faces to three runners 5, which debouch into two distribution chambers 6. Each distribution chamber 6 is connected to two collecting chambers 4.

The liquid encapsulating material that is forced into a distribution chamber 6 will be distributed uniformly over distribution chamber 6 until this latter is completely filled with encapsulating material. To this end the side of distribution chamber 6 directed toward mould cavity 3 is provided with a threshold 8. The space between contact face 9 of mould part 1 and threshold 8 forms an elongate supply opening through which encapsulating material from distribution chamber 6 can be forced into a mould cavity 3. The uniform distribution of pressure exerted on the encapsulating material located in distribution chamber 6 will simultaneously force the liquid encapsulating material into a mould cavity 3 more or less uniformly over the entire length of a threshold 8.

The side of a mould cavity 3 remote from a distribution chamber 6 is provided with gas discharge openings 10. The encapsulating material forced into a mould cavity 3 reduces the volume available for gas in a mould cavity 3, which gas will hereby escape from the mould cavity through gas openings 10. Four discharge openings 10, all elongate in shape, connect onto each mould cavity 3. Gas discharge openings 10 run parallel to threshold 8 of a distribution chamber 6, which defines the supply opening of a mould cavity 3. When the encapsulating material flows into a mould cavity 3, the front of the encapsulating material will move through mould cavity 3 in such a way that it remains more or less parallel to threshold 8. As a result the front will reach gas discharge openings 10 more or less simultaneously. The advantage of a plurality of elongate gas discharge openings 10 is that the gas can escape simultaneously at various points and the gas inclusion hazard can be minimized.

Mould part 1 is also provided with centering pins 11, which allows an accurate fit of upper mould part 1 onto a lower mould part not shown in this figure.

Figure 2:
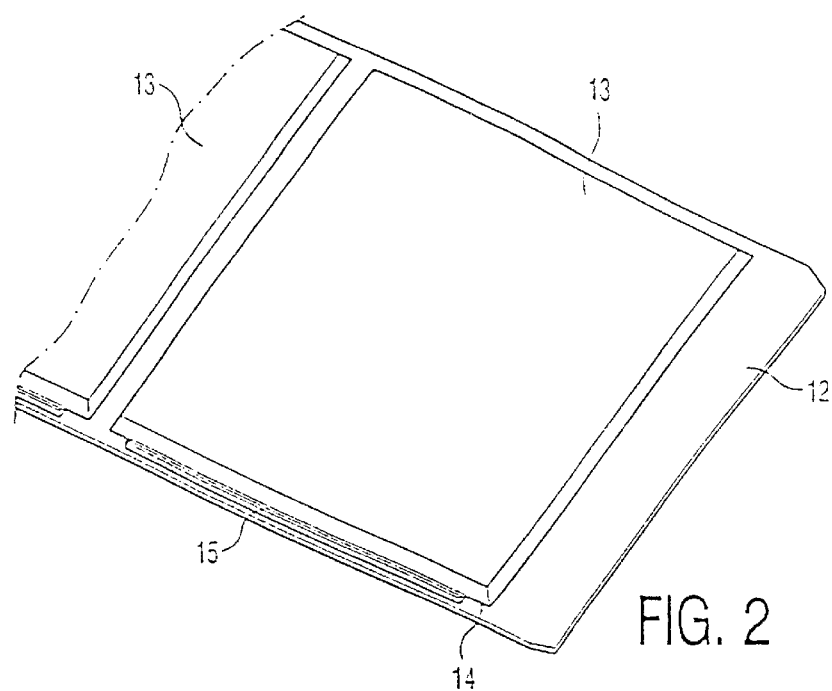
FIG. 2 is a perspective view of an encapsulated electronic component mounted on a carrier according to the invention.

FIG. 2 shows a perspective view of a carrier 12, on which a number of packages of encapsulating material 13 are arranged. These encapsulating material packages 13 encapsulate non-visible electronic components. One gate end 14 of a package of encapsulating material can be seen a residue of encapsulating material 15 which represents the shape of distribution chamber 6 and a supply opening. This will be further illustrated by FIGS. 3 and 4. Encapsulating material package 13 and carrier 12 can then optionally be further machined, for example by sawing the whole into smaller portions, in each of which one or more encapsulated electronic components are located.

Figure 3:
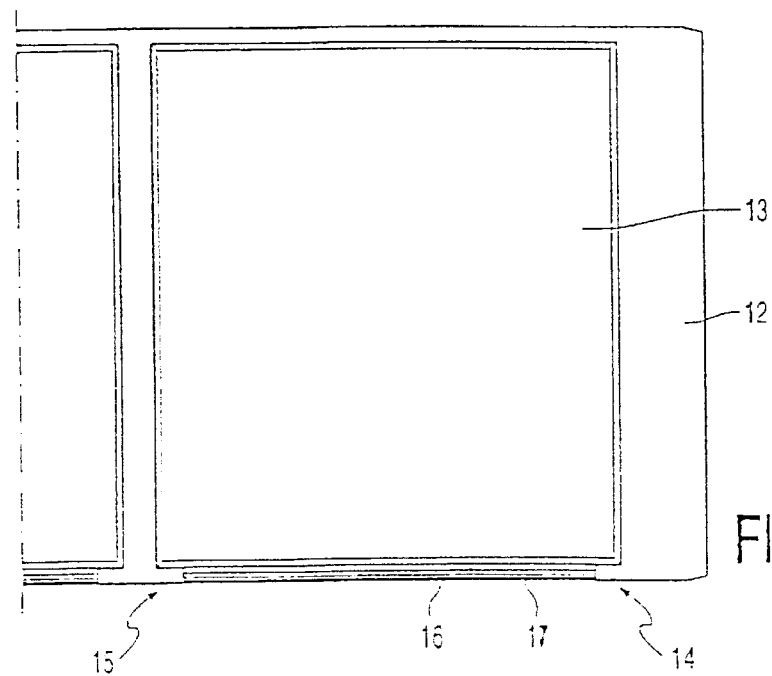
FIG. 3 is a top view of the encapsulated electronic component shown in FIG. 2.

FIG. 3 shows a top view of encapsulating material package 13 and carrier 12, in which can be seen that the residual encapsulating material 15 consists of two parts, i.e. a first section 16 having a shape corresponding with that of distribution chamber 6 as represented in FIG. 1, and a second section 17. The encapsulating material located in distribution chamber 6 during curing will, after the removal of carrier 12 from the mould, form first section 16 of the residual encapsulating material 15. This first section 16 thus has a shape corresponding with that of distribution chamber 6, as shown in FIG. 1. The encapsulating material located during curing in the oblong supply opening situated above threshold 8, as shown in FIG. 1, forms a second section 17 of residual encapsulating material 15. This second section 17 of residual encapsulating material 15 consequently has a shape corresponding with that of the oblong-shaped connection.

Figure 4:
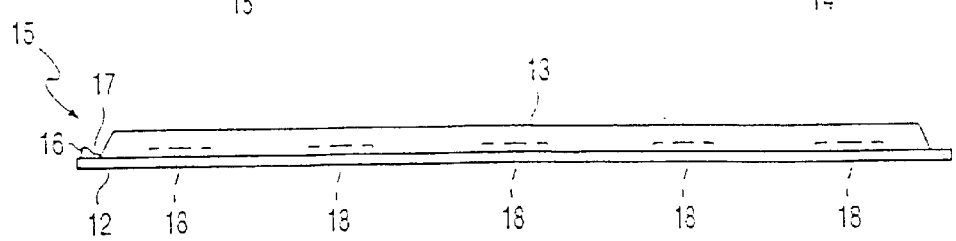
FIG. 4 shows a cross-sectional view of the encapsulated electronic component as shown in FIG. 2.

Finally, FIG. 4 shows a cross-sectional view through encapsulating material package 13 and carrier 12 as shown in FIG. 2, in which five encapsulated electronic components 18 are also visible. Residual encapsulating material 15 is also visible, which clearly shows that first section 16 is higher than second section 17. This is the result of distribution chamber 6 being mounted recessed in a mould part 1 in relation to threshold 8.

What is claimed is:

1. A mould part of a mould encapsulating electronic components mounted on a carrier, comprising at least one mould cavity provided in said mould part and at least one runner for encapsulation material connecting to said mould cavity, wherein a gate from said runner to said mould cavity has an oblong shape, wherein at least one runner debouches into a distribution chamber for encapsulating material, wherein the distribution chamber is recessed farther into said mould part than the gate of oblong shape, and a threshold is positioned between the distribution chamber and mould cavity, and the distribution chamber transposes into the mould cavity by means of the gate of oblong shape.

2. The mould part as claimed in claim 1, wherein the gate of oblong shape from the runner to the mould cavity runs parallel to a contact face of the associated mould part for cooperation with a counter mould part.

3. The mould part as claimed in claim 1, wherein the gate of oblong shape from the runner to the mould cavity is a straight gate which opens onto a straight side of said mould cavity.

4. The mould part as claimed in claim 1, wherein the gate of oblong shape to the mould cavity has at least two linear parts with an oblong shape forming a combined gate with an angular shape which opens onto an angle of said mould cavity.

5. The mould part as claimed in claim 1, wherein the gate of oblong shape from the runner to the mould cavity has a curved shape which opens onto a curved side of said mould cavity.

6. The mould part as claimed in claim 1, wherein the mould cavity is provided with a plurality of oblong gates.

7. The mould part as claimed in claim 1, wherein on the side remote from the gate of the runner the mould cavity connects onto at least one gas discharge opening which has an oblong shape.

8. The mould part as claimed in claim 7, wherein the gates of a plurality of gas discharge openings run substantially parallel to the gate of oblong shape.

9. A mould for encapsulating electronic components mounted on a carrier, comprising at least one mould part as claimed in claim 1.

10. A method for encapsulating electronic components mounted on a carrier comprising the successive steps of:

a) placing one electronic component mounted on a carrier into a mould provided with at least one mould cavity;
b) feeding liquid encapsulating material into the mould cavity;
c) at least partially curing the encapsulating material; and
d) removing the electronic component mounted on the carrier from the mould, wherein the liquid encapsulating material is fed into the mould cavity through a wide supply opening, causing the encapsulating material to flow into the mould cavity in a wide elongate front, wherein the encapsulating material runs from a runner through a distribution chamber into the mould cavity and is fed into the mould cavity as a thin layer with a substantially constant front.

* * * * *

UNITED STATES PATENT AND TRADEMARK OFFICE
CERTIFICATE OF CORRECTION

PATENT NO. : 6,428,731 B1  
DATED : August 6, 2002  
INVENTOR(S) : Hendrikus Johannes Bernardus Peters and Marcel Gerardus Antonius Tomassen It is certified that error appears in the above-identified patent and that said Letters Patent is hereby corrected as shown below:

<u>Title page,</u>  
Item [57], ABSTRACT,  
Line 3, "composing" should read -- comprising --.

<u>Column 1,</u>  
Line 12, "from" should read -- form --.

<u>Column 4,</u>  
Line 4, "One gate" should read -- On one gate --.

Signed and Sealed this

Twenty-eighth Day of January, 2003

JAMES E. ROGAN  
*Director of the United States Patent and Trademark Office*